United States Patent
Lee et al.

(10) Patent No.: US 9,006,771 B2
(45) Date of Patent: Apr. 14, 2015

(54) ORGANIC LIGHT EMITTING DIODE AND METHOD FOR MANUFACTURING THE SAME

(75) Inventors: Jung-Hyoung Lee, Daejeon (KR); Jung-Bum Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/207,209

(22) Filed: Aug. 10, 2011

(65) Prior Publication Data

US 2012/0037948 A1 Feb. 16, 2012

(30) Foreign Application Priority Data

Aug. 11, 2010 (KR) .............................. 2010-0077230

(51) Int. Cl.
*H01L 51/56* (2006.01)
*H01L 51/52* (2006.01)

(52) U.S. Cl.
CPC ............ *H01L 51/52* (2013.01); *H01L 51/5212* (2013.01); *H01L 2251/5361* (2013.01)

(58) Field of Classification Search
CPC . H01L 33/08; H01L 27/3253; H01L 27/3246; H01L 51/52; H01L 51/5228; H01L 51/5206; H01L 27/3248; H01L 51/5259; H01L 51/5275; H01L 31/0488
USPC ............................. 257/99, 40, 103, 88, 98, 46
See application file for complete search history.

(56) References Cited

U.S. PATENT DOCUMENTS

| | | | |
|---|---|---|---|
| 4,356,429 A * | 10/1982 | Tang .............................. | 313/503 |
| 2003/0227021 A1* | 12/2003 | Yamazaki et al. .............. | 257/83 |
| 2005/0116620 A1* | 6/2005 | Kobayashi .................... | 313/503 |
| 2007/0052353 A1* | 3/2007 | Yang et al. .................... | 313/506 |
| 2007/0132374 A1* | 6/2007 | Park ............................. | 313/504 |
| 2008/0122347 A1* | 5/2008 | Lee .............................. | 313/504 |
| 2008/0192167 A1* | 8/2008 | Maeda .......................... | 349/58 |
| 2009/0059135 A1* | 3/2009 | Park et al. ..................... | 349/96 |
| 2009/0148968 A1* | 6/2009 | You ................................ | 438/22 |
| 2009/0280714 A1* | 11/2009 | Fukuda et al. ................. | 445/25 |
| 2010/0230664 A1* | 9/2010 | Yamazaki et al. ............. | 257/40 |

FOREIGN PATENT DOCUMENTS

KR  10-2007-0065097   6/2007

* cited by examiner

*Primary Examiner* — Kenneth Parker
*Assistant Examiner* — Bo Fan
(74) *Attorney, Agent, or Firm* — McKenna Long & Aldridge LLP

(57) ABSTRACT

An exemplary embodiment of the present invention provides an organic light emitting diode, comprising a substrate, a first electrode, an organic material layer, and a second electrode, wherein a trench comprising a concave part and a convex part is provided on the substrate, the first electrode is provided on the substrate on which the trench is formed by being deposited, and an auxiliary electrode is provided on the first electrode. The organic light emitting diode according to the exemplary embodiment of the present invention may increase surface areas of the first electrode and the auxiliary electrode formed on the substrate, thereby implementing a low resistance electrode. In addition, since a line width of the electrode is not increased, it is possible to prevent a decrease of an opening ratio of the organic light emitting diode.

14 Claims, 3 Drawing Sheets

ORGANIC LIGHT EMITTING DIODE AND METHOD FOR MANUFACTURING THE SAME

This application claims priority from Korean Patent Application No. 10-2010-0077230 filed on Aug. 11, 2010 in the KIPO, the disclosure of which is incorporated herein by reference in its entirety.

TECHNICAL FIELD

The present invention relates to an excellent organic light emitting diode that can ensure brightness uniformity and stability of the diode by minimizing a voltage decrease of a transparent electrode layer, and a method for manufacturing the same.

BACKGROUND ART

An organic light emitting diode is formed of two opposite electrodes and thin films of organic materials having multi-layered semiconductor properties existing therebetween. The organic light emitting diode of the above configuration uses a phenomenon where electric energy is converted into light energy by using an organic material, that is, an organic light emission phenomenon. In detail, in the structure where the organic material layer is disposed between the anode and the cathode, if a voltage is applied between two electrodes, holes are injected to the organic material layer in the anode and electrons are injected into the organic material layer in the cathode. The injected holes and the electrons meet each other to form an exciton, and the exciton is reduced to a bottom state to emit light.

In the above organic light emitting diode, light that is generated in the organic material layer is discharged through the light transmissive electrode, and the organic light emitting diode may be generally classified into a top emission type, a bottom emission type and a dual emission type. In the case of the top emission or bottom emission type, one of two electrodes should be a light transmissive electrode, and in the case of the dual emission type, all the two electrodes should be a light transmissive electrode.

In respect to the organic light emitting diode, many studies have been concentrated since Kodak, Co. Ltd. announced that in the case where the multilayer structure is used, driving at a low voltage is implemented, and recently, a natural color display using the organic light emitting diode is attached to a mobile phone and commercialized.

In addition, a study for the recent organic light emitting diode using a phosphorescent material instead of a known fluorescent material has been made, such that efficiency is rapidly improved, and it is expected that the diode would be able to replace a known lighting in the near future.

In order to use the organic light emitting diode as lighting, unlike a known natural color display, the diode should be driven at high brightness, and a constant brightness should be maintained like a known lighting. In order to sufficiently improve brightness of the organic light emitting diode, light emission should be implemented in a large area, and in order to implement light emission in the large area, a high driving current should be used. In addition, in order to maintain the constant brightness in the large area, the above high current should be uniformly injected into the diode having the large area.

In general, as the anode material of the organic light emitting diode, metal oxide having a large work function is mainly used. However, the electroconductivity of the metal oxide is not relatively high. Accordingly, in the case where the metal oxide is used in an organic EL or a LCD having a small display area, there is no problem, but in the case where the metal oxide is used in an organic EL having a large area for being used in lighting devices, a voltage decrease by a high current is large, such that the current is not uniformly injected into a light emission surface, and therefore light emission of the diode is not uniformly implemented. For example, in the electrode, light emission occurs only around a portion that is electrically connected to a driving circuit and weak light emission may occur or no light emission may occur in the remaining region.

Meanwhile, as the cathode material of the organic light emitting diode, the metal having the small work function or an alloy thereof is mainly used. The above metal may have the high electroconductivity, but in the case where transparency of the electrode is required because of characteristics of the organic light emitting diode, if the electrode is formed of a thin film, the electroconductivity is decreased. Accordingly, even in the above case, since the current is not uniformly injected into the light emission surface, light emission of the diode is not uniformly implemented.

Therefore, in order to use the organic light emitting diode as the lighting device, the light emission of high brightness needs to uniformly occur in the diode having the large area by decreasing resistance of the electrode.

In addition, the decrease of the resistance of the electrode may also be usefully used in manufacturing of the organic light emitting diode having the large area and a passive matrix display diode. Since the passive matrix display does not require an amorphous or poly-silicon thin film transistor back plate like an active matrix, a manufacturing cost is very low. However, recently, since the passive matrix organic EL display has various problems, an active matrix organic EL display rather than the passive matrix organic EL display is rising as a candidate for commercialization. One of the important problems of the passive matrix organic EL display is an essential technology for manufacturing an electrode having excellent light transmission and electroconductivity in manufacturing of the passive matrix organic EL display diode, but if resistance of the recently used electrode is large and the size of the display is increased by this, a voltage decrease in the electrode becomes serious, such that it is difficult to implement a display image.

Accordingly, in an organic light emitting diode field, development of a technology for decreasing resistance of the electrode is required.

DISCLOSURE

Technical Problem

The present invention has been made in an effort to provide an organic light emitting diode that ensures brightness uniformity and stability of the diode by minimizing a voltage decrease of a transparent electrode layer, and has an auxiliary electrode that can be formed by a simple process, and a method for manufacturing the same.

Technical Solution

An exemplary embodiment of the present invention provides an organic light emitting diode, comprising a substrate, a first electrode, an organic material layer, and a second electrode, wherein a trench comprising a concave part and a convex part is provided on at least a portion of the substrate, the first electrode is provided on the substrate on which the trench is formed by being deposited, and an auxiliary electrode is provided on the first electrode.

Advantageous Effects

The organic light emitting diode according to the exemplary embodiment of the present invention may increase surface areas of the first electrode and the auxiliary electrode formed on the substrate even in the case where the thickness of the metal auxiliary electrode is not increased or the line width thereof is not increased like a known art, thereby implementing a low resistance electrode. In addition, since a line width of the electrode is not increased, it is possible to prevent a decrease of an opening ratio of the organic light emitting diode.

DESCRIPTION OF REFERENCE NUMERALS AND SIGNS

Figure 1:
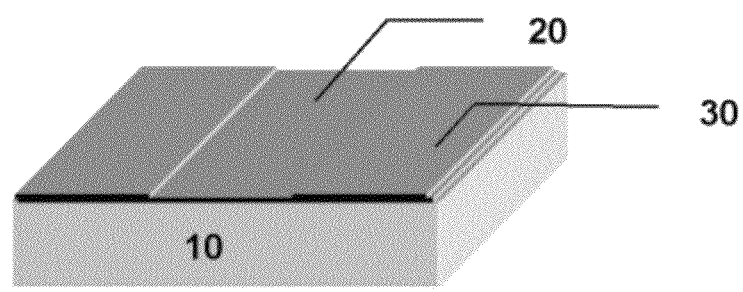
FIG. 1 is a view that illustrates a known transparent electrode structure.

10: Substrate
20: First electrode
30: Auxiliary electrode

[Best Mode]

Hereinafter, the present invention will be described in detail.

In general, an organic light emitting diode has a structure in which two electrodes having a large area face each other and an organic material layer that emits light by a current is formed therebetween. The current is applied at an edge of the electrode, flows toward the center of the electrode, passes through an organic material, and is discharged to an electrode facing the above electrode, and in this case, a voltage decrease occurs in proportion to resistance of the electrode while the current flows to the center of the electrode at the edge thereof. Since energy is consumed by a voltage decrease occurring by resistance of the electrode, an energy efficiency of the organic light emitting diode is decreased.

In addition, since electric fields formed between two electrodes varies, an amount of emitted light of an organic material varies according to a position of the electrode, and a difference in brightness according to the position thereof is not good in terms of an appearance and negatively affects stability of the diode. Accordingly, in the organic light emitting diode, a design for minimizing these problems is needed.

The organic light emitting diode has a structure in which two transparent electrodes or the transparent electrode and the metal electrode face each other. The voltage decrease problem in the electrode becomes a problem in the transparent electrode that has a relatively high surface resistance. As the transparent electrode, ITO (indium tin oxide) and the like are used, and the surface resistance value of the transparent electrode comprising ITO is 10 to 30Ω/□, which is different from 0.3Ω/□ that is the surface resistance value of the metal electrode manufactured by depositing Al in 100 nm by about 100 times. In order to decrease the surface resistance value of the transparent electrode, a method for forming a metal auxiliary electrode on a transparent electrode is generally used, and in order to uniformly decrease the surface resistance value without decreasing an opening ratio of a light emission region surface, a fine metal electrode should be formed, and to this end, a photolithography method is used.

However, there is a disadvantage in that this process requires a high process cost. In addition, a metal electrode layer is also deposited together with the organic material layer on the metal auxiliary electrode, and in this case, because of a short circuit damage between the metal auxiliary electrode and the metal electrode on the transparent electrode, there is a problem in that when the metal auxiliary electrode is formed, an insulation layer is further formed thereon.

Accordingly, the exemplary embodiment of the present invention provides an organic light emitting diode that can ensure brightness uniformity and stability of the diode by minimizing a voltage decrease of a transparent electrode layer even without forming a very fine auxiliary electrode.

An organic light emitting diode according to the exemplary embodiment of the present invention comprises a substrate, a first electrode, an organic material layer, and a second electrode, wherein a trench comprising a concave part and a convex part is provided on at least a portion of the substrate, the first electrode is provided on the substrate on which the trench is formed by being deposited, and an auxiliary electrode is provided on the first electrode.

In the organic light emitting diode according to the exemplary embodiment of the present invention, it is preferable that the trench is provided to correspond to a region in which the auxiliary electrode is provided.

In the organic light emitting diode according to the exemplary embodiment of the present invention, a substrate that is known in the art may be used without limitation, and in more detail, there may be a glass substrate and a plastic substrate, but it is not limited thereto.

Figure 2:
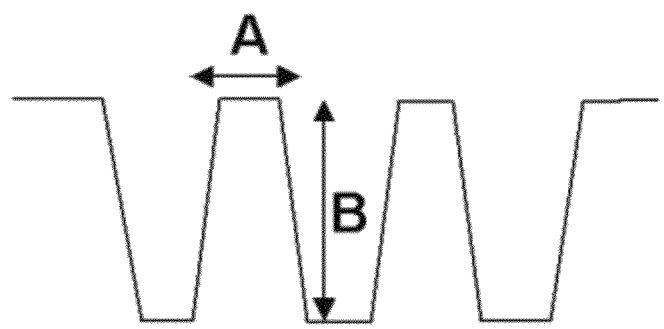
FIG. 2 is a view that illustrates a structure of a trench formed on a substrate of an organic light emitting diode according to an exemplary embodiment of the present invention.

In the organic light emitting diode according to the exemplary embodiment of the present invention, the trench comprising a concave part and a convex part is formed on the substrate. An exemplary embodiment of the structure of the trench is illustrated in detail in FIG. 2, but is not limited thereto. An aspect ratio of the trench may be 0.1 to 10, but is not limited thereto.

The organic light emitting diode according to the exemplary embodiment of the present invention may increase the surface areas of the first electrode and the auxiliary electrode deposited on the substrate by forming the trench comprising the concave part and the convex part on the substrate. For example, in the case where the aspect ratio (B/A) of the trench is 1, the surface area may be increased by about two times, and in the case where the aspect ratio (B/A) of the trench is 2, the surface area may be increased by about three times.

In the organic light emitting diode according to the exemplary embodiment of the present invention, the trench formed on the substrate may be formed on a portion except for the light emission region of the organic light emitting diode. That is, the trench may be formed on the position on which the auxiliary electrode is formed on the first electrode.

In the organic light emitting diode according to the exemplary embodiment of the present invention, the first electrode is formed on the substrate on which the trench is formed by being deposited, and the auxiliary electrode is provided on the first electrode.

In addition, in the organic light emitting diode according to the exemplary embodiment of the present invention, the first electrode may be the transparent electrode, and the second electrode may be the metal electrode, but are not limited thereto.

The first electrode may be formed by depositing indium tin oxide (ITO), and the second electrode may be formed by depositing Al.

The metal auxiliary electrode may be formed in order to decrease the surface resistance value on the first electrode. The metal auxiliary electrode may be formed by using a material and a method known in the art. For example, the electrode may be formed by using one or more of Cr, Mo, and oxides thereof and by a photolithography method.

For example, the organic light emitting diode according to the exemplary embodiment of the present invention may be manufactured by forming a first electrode by depositing metal or metal oxides having the conductivity or an alloy thereof on a substrate by using a PVD (physical vapor deposition) method such as sputtering or e-beam evaporation, forming the organic material layer thereon, and depositing a material capable of being used as a second electrode thereon.

In the organic light emitting diode according to the exemplary embodiment of the present invention, the organic material layer may be manufactured in the smaller number of layers by using various polymer materials and by using not a deposition method but a solvent process, for example, spin coating, dip coating, doctor blading, screen printing, inkjet printing, heat transferring method and the like.

The organic material layer according to the exemplary embodiment of the present invention may be a laminate structure that comprises a light emitting layer, and one or more selected from a hole injection layer, a hole transport layer, an electron transport layer, and an electron injection layer.

In the organic light emitting diode according to the exemplary embodiment of the present invention, as a material that can form the hole injection layer, in general, it is preferable to use a material having a large work function so that hole injection to the organic material layer is smooth. As detailed examples of the hole injection material that can be used in the present invention, there are metal such as vanadium, chrome, copper, zinc, and gold or an alloy thereof; metal oxides such as zinc oxides, indium oxides, indium tin oxides (ITO), and indium zinc oxides (IZO); a combination of metal and oxides such as $ZnO:Al$ or $SnO_2:Sb$; and conductive polymers such as poly(3-methylthiophene), poly [3,4-(ethylene-1,2-dioxy)thiophene] (PEDT), polypyrrole, and polyaniline, but it is not limited thereto.

In the organic light emitting diode according to the exemplary embodiment of the present invention, as a material that can form the electron injection layer, in general, it is preferable to use a material having a small work function so that electron injection to the organic material layer is easily performed. As detailed examples of the electron injection material, there are metal such as magnesium, calcium, sodium, potassium, titanium, indium, yttrium, lithium, gadolinium, aluminum, silver, tin, and lead or an alloy thereof; a multi-layered structure material such as LiF/Al or $LiO_2/Al$, and the same material as the hole injection electrode material may be used, but they are not limited thereto.

In the organic light emitting diode according to the exemplary embodiment of the present invention, as the material that can form the light emitting layer, it is preferable to use a material that can emit light in visible ray region by receiving holes and electrons from the hole transport layer and the electron transport layer, respectively and combining the layers and has good quantum efficiency in respect to fluorescent or phosphorescent light. As detailed examples thereof, there are a 8-hydroxy-quinoline aluminum complex ($Alq_3$); a carbazole-based compound; a dimerized styryl compound; BAlq; 10-hydroxybenzoquinoline-metal compound; a benzoxazole, benzthiazole, and benzimidazole-based compound; a poly(p-phenylenevinylene) (PPV)-based polymer; a spiro compound; polyfluorene, lubrene; and phosphorescent host CBP [[4.4'-bis(9-carbazoly)biphenyl], but they are not limited thereto.

In addition, the light emitting material may further comprise a phosphorescent dopant or a fluorescent dopant in order to improve fluorescent or phosphorescent characteristics. As detailed examples of the phosphorescent dopant, there are ir(ppy)3(fac tris(2-phenylpyridine) iridium) or F2Irpic [iridium(III)bis[4.6,-di-fluorophenyl-pyridinato-N,C2) picolinate]. As the fluorescent dopant, materials known in the art may be used.

In the organic light emitting diode according to the exemplary embodiment of the present invention, as the material that can form the electron transport layer, it is preferable to use a material that can receive electrons well from the electron injection layer and transport the electrons to the light emitting layer and has a large mobility in respect to the electron. As detailed examples thereof, there are a 8-hydroxyquinoline Al complex; a complex comprising $Alq_3$; an organic radical compound; a hydroxyflavone-metal complex and the like, but it is not limited thereto.

It is preferable that the organic light emitting diode according to the exemplary embodiment of the present invention is an organic light emitting diode for lighting.

In particular, in the related art, in order to decrease resistance of the transparent electrode, a method for increasing a thickness of the metal auxiliary electrode or increasing a line width thereof is used. However, the organic light emitting diode according to the exemplary embodiment of the present invention may increase the surface areas of the transparent electrode and the metal auxiliary electrode by forming the trench on the substrate, thereby decreasing resistance of the transparent electrode. In addition, since the line width of the transparent electrode and the metal auxiliary electrode is not increased, the opening ratio of the organic light emitting diode is not decreased.

Figure 3:
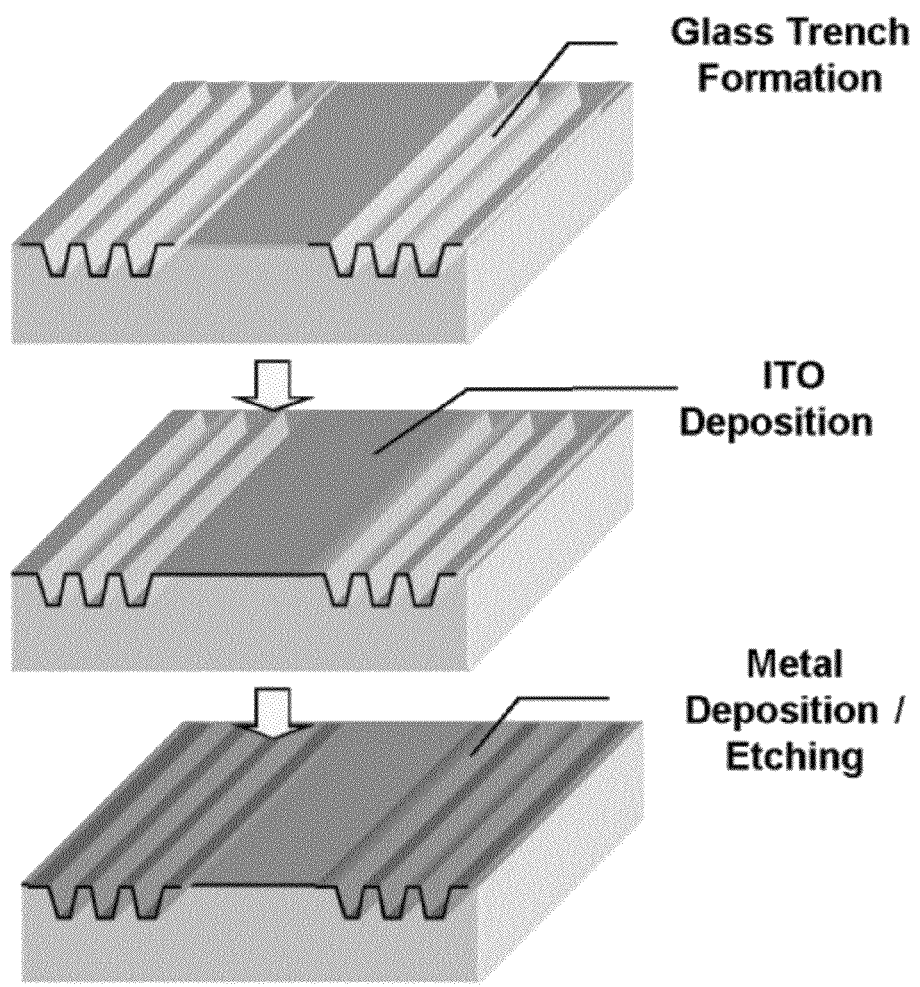
FIG. 3 is a view that illustrates a formation step of a transparent electrode of an organic light emitting diode according to the exemplary embodiment of the present invention.
Figure 4:
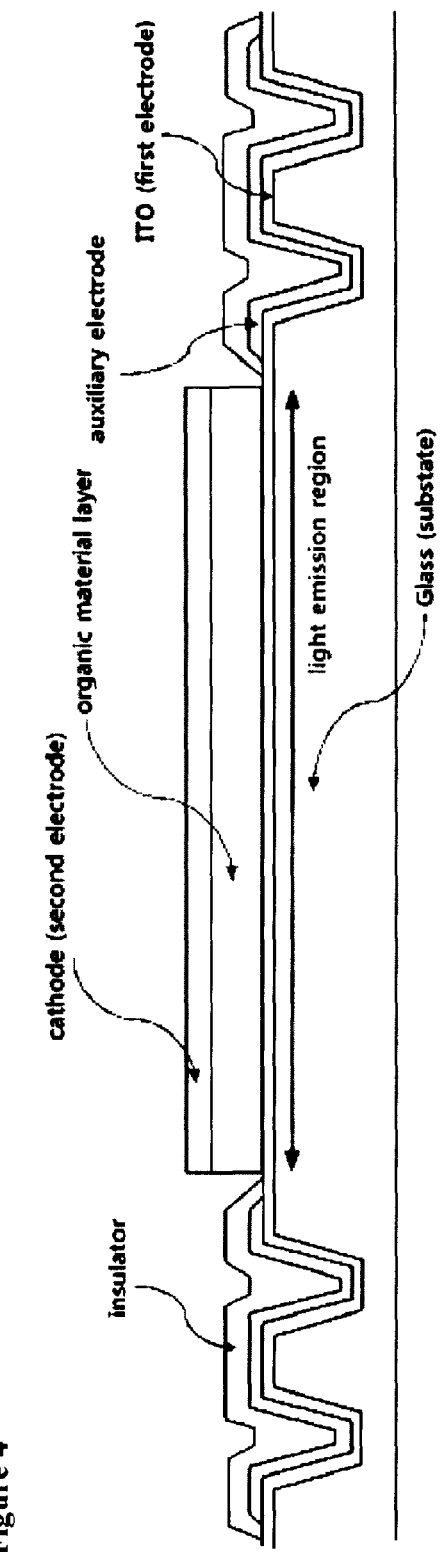
FIG. 4 is a cross-sectional view of an organic light emitting diode according to the exemplary embodiment of the present invention.

A formation step of a transparent electrode of an organic light emitting diode according to the exemplary embodiment of the present invention is illustrated in FIG. 3.

The organic light emitting diode according to the exemplary embodiment of the present invention may form a transparent electrode through the steps of forming the trench comprising the concave part and the convex part on the substrate, depositing the first electrode material such as ITO, and depositing the auxiliary electrode material such as metal.

The organic light emitting diode according to the exemplary embodiment of the present invention may increase surface areas of the first electrode and the auxiliary electrode formed on the substrate even in the case where the thickness of the metal auxiliary electrode is not increased or the line width thereof is not increased like a known art, thereby implementing a low resistance electrode. In addition, since a line width of the electrode is not increased, it is possible to prevent a decrease of an opening ratio of the organic light emitting diode.

The invention claimed is:

1. An organic light emitting diode having a light emission region and comprising: a substrate, a first electrode, a first portion of which includes the substantially planar light emission region, the first electrode provided on the substrate, an auxiliary electrode provided on a second portion of the first electrode, and not provided on the first portion of the first electrode, a second electrode, a portion of which includes the light emission region, and an organic material layer disposed between the first electrode and the second electrode, wherein the substrate includes a trench formed in an upper surface and wherein the first electrode is provided on the trench of the substrate such that the first electrode includes a trench corresponding to the trench formed in the substrate, and wherein the auxiliary electrode is provided on the trench of the first electrode.

2. The organic light emitting diode according to claim 1, wherein the substrate is a glass substrate or a plastic substrate.

3. The organic light emitting diode according to claim 1, wherein an aspect ratio of the trench of the substrate is 0.1 to 10.

4. The organic light emitting diode according to claim 1, wherein the first electrode is a transparent electrode, and the second electrode is a metal electrode.

5. The organic light emitting diode according to claim 1, wherein the first electrode comprises ITO (indium tin oxide).

6. The organic light emitting diode according to claim 1, wherein the auxiliary electrode comprises one or more selected from the group consisting of Cr, Mo, and oxides thereof.

7. The organic light emitting diode according to claim 1, wherein the organic light emitting diode is an organic light emitting diode for lighting.

8. The organic light emitting diode according to claim 1, wherein the substrate includes a second trench adjacent to the first trench of the substrate, and wherein the first electrode is provided on the second trench of the substrate such that the first electrode includes a second trench corresponding to the second trench formed in the substrate, and wherein the auxiliary electrode is provided on the second trench of the first electrode.

9. The organic light emitting diode according to claim 8, wherein the substrate includes a third trench opposite the first trench of the substrate, the second trench of the substrate, and the light emission region, and wherein the first electrode is provided on the third trench of the substrate such that the first electrode includes a third trench corresponding to the third trench formed in the substrate, and wherein the auxiliary electrode is provided on the third trench of the first electrode.

10. The organic light emitting diode according to claim 8, wherein the substrate includes a fourth trench adjacent to the third trench, and wherein the first electrode is provided on the fourth trench of the substrate such that the first electrode includes a fourth trench corresponding to the fourth trench formed in the substrate, and wherein the auxiliary electrode is provided on the fourth trench of the first electrode.

11. The organic light emitting diode according to claim 1, wherein the substrate includes a third trench opposite the first trench of the substrate and the light emission region, and wherein the first electrode is provided on the third trench of the substrate such that the first electrode includes a third trench corresponding to the third trench formed in the substrate, and wherein the auxiliary electrode is provided on the third trench of the first electrode.

12. The organic light emitting diode according to claim 1, wherein the substrate is a glass substrate or a plastic substrate, wherein the first and third trenches of the substrate extends partially through the substrate, and wherein an aspect ratio of the first and third trenches of the substrate is 0.1 to 10.

13. The organic light emitting diode according to claim 11, wherein the auxiliary electrode decreases the surface resistance of the first electrode.

14. An organic light emitting diode having a light emission region and comprising: a substrate, a first electrode, a first portion of which includes the substantially planar light emission region, the first electrode provided on the substrate, an auxiliary electrode provided on a second portion of the first electrode, a second electrode, a portion of which includes the light emission region, and an organic material layer disposed between the first electrode and the second electrode, wherein the substrate includes a trench formed in an upper surface of the substrate except for a light emission region of the organic light emitting diode, and wherein the first electrode is provided on the trench of the substrate such that the first electrode includes a trench corresponding to the trench formed in the substrate, and wherein the auxiliary electrode is provided on the trench of the first electrode, and the light emission region is positioned on a region where the auxiliary electrode is not formed.

* * * * *